(12) United States Patent
Teng et al.

(10) Patent No.: US 8,228,384 B2
(45) Date of Patent: Jul. 24, 2012

(54) CIRCUIT TESTING APPARATUS

(75) Inventors: Cheng-Yung Teng, Taipei County (TW);
Yi-Chang Hsu, Taipei County (TW);
Wei-Fen Chiang, Taipei (TW); Jack Lin, Yilan County (TW); Li-Ying Chang, Taipei County (TW)

(73) Assignee: Princeton Technology Corporation, Xindian Dist., New Taipei (TW)

( * ) Notice: Subject to any disclaimer, the term of this patent is extended or adjusted under 35 U.S.C. 154(b) by 1358 days.

(21) Appl. No.: 11/616,874

(22) Filed: Dec. 28, 2006

(65) Prior Publication Data

US 2008/0063212 A1    Mar. 13, 2008

(30) Foreign Application Priority Data

Aug. 24, 2006   (TW) ............................... 95215014 U

(51) Int. Cl.
*H04N 17/00* (2006.01)

(52) U.S. Cl. ........ 348/180; 348/181; 348/190; 348/192; 348/189

(58) Field of Classification Search .................. 348/190, 348/181, 187, 189, 192; 702/108, 190; 324/762.01, 324/762.02; 714/715, 716; 381/58
See application file for complete search history.

(56) References Cited

U.S. PATENT DOCUMENTS 7,868,639 B1 * 1/2011 Shirvani-Mahdavi et al. ........................ 324/762.02

* cited by examiner

*Primary Examiner* — Jefferey Harold
*Assistant Examiner* — Jean W Desir
(74) *Attorney, Agent, or Firm* — Winston Hsu; Scott Margo

(57) ABSTRACT

The invention discloses a circuit testing apparatus for testing a device under test. The circuit testing apparatus includes a filtering circuit, an amplifying circuit, a comparing module, and a result-examining module. The filtering circuit filters an analog output signal generated from the device under test to generate a filtered signal. The amplifying circuit amplifies the filtered signal to generate an amplified signal. The comparing module compares the amplified signal with at least one reference level to generate at least one result signal accordingly. The result-examining module examines the result signal to determine a test result for the device under test.

20 Claims, 3 Drawing Sheets

CIRCUIT TESTING APPARATUS

BACKGROUND OF THE INVENTION

1. Field of the Invention

The present invention relates to a testing circuit, and more particularly, to a circuit testing apparatus capable of testing an analog signal accurately.

2. Description of the Prior Art

With developments of technology, the functions of an integrated circuit (IC) become more and more complicated. In addition to analog-signal integrated circuits (ICs) for purely processing analog signals, and digital-signal ICs for purely processing digital signals, multiple ICs capable of processing analog and digital signals are also available, and are usually called mixed-signal ICs. In general, each IC, whether it is a digital-signal IC, an analog-signal IC or a mixed-signal IC, will be tested after its fabrication process to ensure the quality. Manufacturers determine whether an IC can be sold to customers according to the test results. Taking an example of a common IC testing scheme, a mixed-signal tester is usually utilized for testing ICs after the fabrication process. Current mixed-signal testers are very expensive; therefore, if the mixed-signal testers are utilized for testing analog-signal ICs or mixed-signal ICs, a long testing period is required and the total cost increases significantly.

Additionally, in comparison to testing digital-signal ICs, testing analog-signal ICs and mixed-signal ICs is more complicated, and accuracy requirements often need to be higher. The accuracy of a conventional testing scheme for testing analog signals generated from analog-signal ICs (or mixed-signal ICs) is not good enough, however. The accuracy is often down to only 10 mV~20 mV. If an analog signal under test is amplified through a system by +60 dB~100 dB, noise existing in the analog signal under test may be amplified from a voltage level below 10 mV to a voltage level above 10V, and the system will be influenced by the amplified noise. In other words, a test result may not be reliable. It is important to provide a testing scheme capable of supporting a higher accuracy requirement to increase reliability of the system.

SUMMARY OF THE INVENTION

Therefore one of the objectives of the present invention is to provide a testing scheme capable of reducing cost and improving accuracy, to solve the above-mentioned problems.

According to embodiments of the present invention, a circuit testing apparatus for testing a device is disclosed. The circuit testing apparatus comprises a filtering circuit, an amplifying circuit, a comparing module, and a result-examining module. The filtering circuit is utilized for filtering an analog output signal generated by the device under test to generate a filtered signal. The amplifying circuit is coupled to the filtering circuit and utilized for amplifying the filtered signal to generate an amplified signal. The comparing module is coupled to the amplifying circuit and utilized for comparing the amplified signal with at least a reference level to generate at least a result signal. The result-examining module is coupled to the comparing module and utilized for examining the result signal to determine a test result of the device under test.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
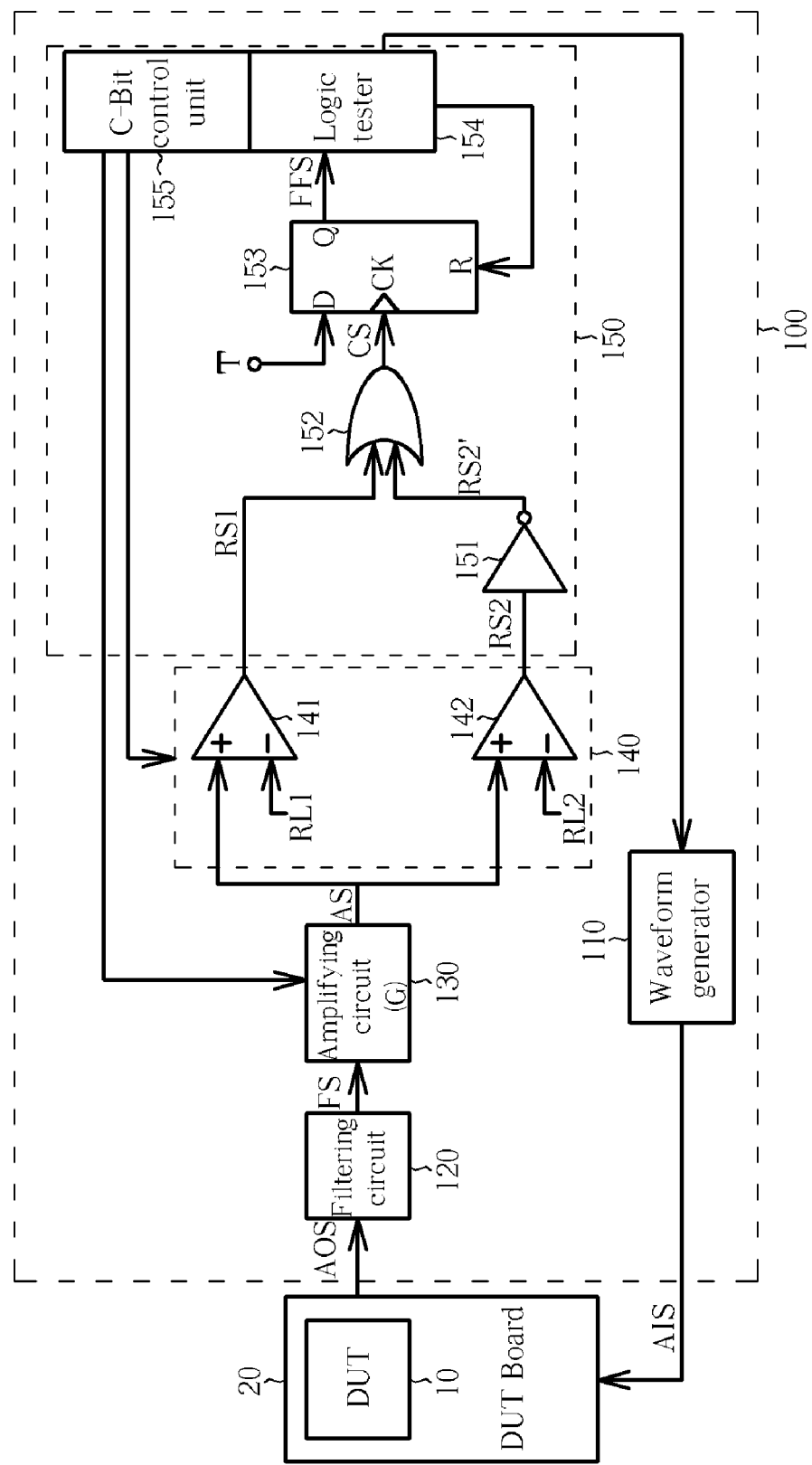
FIG. 1 is a diagram of a circuit testing apparatus according to a first embodiment of the present invention.

Please refer to FIG. 1. FIG. 1 is a diagram of a circuit testing apparatus 100 according to a first embodiment of the present invention. In this embodiment, the circuit testing apparatus 100 is utilized for testing a Device Under Test (DUT) 10. More particularly, the circuit testing apparatus 100 tests an analog output signal AOS generated from the DUT 10 to determine if the DUT 10 passes tests. The DUT 10 can be an analog integrated circuit (IC) or a mixed IC on a Device Under Test board (DUT board) 20, and the analog output signal AOS can be an analog audio signal. Additionally, the circuit testing apparatus 100 can be utilized for testing if a clicking noise, popping noise, or other noise exists in the analog output signal AOS.

As shown in FIG. 1, the circuit testing apparatus 100 comprises a waveform generator 110, a filtering circuit 120, an amplifying circuit 130, a comparing module 140, and a result-examining module 150. The comparing module 140 comprises a first comparing circuit 141 and a second comparing circuit 142. The result-examining module 150 comprises an inverter 151, an OR gate 152, a flip-flop 153, and a logic tester 154. The waveform generator 110 is utilized for generating an analog input signal AIS to provide for the DUT 10 according to a control by the logic tester 154, and the DUT 10 then generates the analog output signal AOS according to the analog input signal AIS. In this and the following embodiments, the waveform generator 110 is an optional element; that is, the waveform generator 110 can be removed in other embodiments. For example, in other embodiments, if the analog output signal AOS can be directly generated by the DUT 10, the waveform generator 110, a circuit interface for coupling the waveform generator 110 to the DUT 10, and a circuit interface of the logic tester 154 will be removed from the circuit testing apparatus 100.

The filtering circuit 120 is a band pass filter (BPF) and utilized for filtering out frequency components in the analog output signal outside a band where sounds can be heard by human ears in order to generate the filtered signal FS. For example, the band where sounds can be heard by human ears is approximately 20 Hz~20 KHz, so the filtering circuit 120 can be achieved by a high pass filter (HPF) having a cut-off frequency at 20 Hz and a low pass filter (LPF) having a cut-off frequency at 20 KHz. The amplifying circuit 130 is utilized for amplifying the filtered signal FS to generate an amplified signal AS according to a gain G of the amplifying circuit 130. The gain G is adjustable, and the logic tester 154 controls the gain G by a continuous built-in test (C-Bit) control unit 155. In addition, in this embodiment, the amplifying circuit 130 only has one amplifying path. However, in other embodiments, the amplifying circuit 130 has two amplifying paths. That is, the amplifying circuit 130 is composed of a first amplifying circuit and a second amplifying circuit (both the first and second amplifying circuits are not shown in FIG. 1). The first amplifying circuit is utilized for amplifying the filtered signal FS to generate a first amplified signal AS1 according to a first gain G1 and for outputting the first amplified signal AS1 to the first comparing circuit 141. The second amplifying circuit is utilized for amplifying the filtered signal FS to generate a second amplified signal AS2 according to a second gain G2 and for outputting the second amplified signal AS2 to the second comparing circuit 142. The logic tester 154 controls the first gain G1 and second gain G2 utilizing the C-Bit control unit 155.

The first comparing circuit 141 is utilized for comparing the amplified signal AS with a first reference level RL1 to generate a first result signal RS1. The second comparing circuit 142 is utilized for comparing the amplified signal AS with a second reference level RL2 to generate a second result signal RS2. In this embodiment, the first reference level RL1 is designed to be a positive voltage level and the second reference level RL2 is designed to be a negative voltage level. However, this is not meant to be a limitation of the present invention. Utilizing the first comparing circuit 141 and second comparing circuit 142, both the voltage levels of the first result signal RS1 and second result signal RS2 correspond to a logic value '1' when a voltage level of the amplified signal AS is higher than that of the first reference level RL1. The voltage level of the first result signal RS1 corresponds to a logic value '0' and the voltage level of the second result signal RS2 corresponds to the logic value '1' when the voltage level of the amplified signal AS is between the first reference level RL1 and second reference level RL2. Similarly, both the voltage levels of the first result signal RS1 and second result signal RS2 correspond to the logic value '0' when the voltage level of the amplified signal AS is lower than that of the second reference level RL2. Furthermore, the first and second reference levels RL1, RL2 are adjustable and controlled by the logic tester 154 through the C-Bit control unit 155.

In the result-examining module 150, the inverter 151 is utilized for inverting the second result signal RS2 to generate an inverted result signal RS2', and the OR gate 152 is utilized for performing a logic OR operation on the first result signal RS1 and the inverted result signal RS2' to generate a combined signal CS. In this embodiment, the flip-flop 153 is a D-type flip-flop having an input terminal D, a clock input terminal CK, a reset terminal R, and an output terminal Q. The input terminal D is utilized for receiving a specific logic value '1', and the clock input terminal CK is coupled to the OR gate 152 and utilized for receiving the combined signal CS. The reset terminal R is coupled to the logic tester 154 and utilized for receiving a reset command from the logic tester 154, and the output terminal Q is utilized for outputting a flip-flop signal FFS to the logic tester 154.

Before starting tests, the logic tester 154 resets the flip-flop 153 to reset the flip-flop signal FFS as a voltage level corresponding to the logic value '0'. After starting tests, the logic tester 154 determines a test result for the DUT 10 according to the flip-flop signal FFS. If the flip-flop signal FFS is continuously kept at the voltage level corresponding to the logic value '0' after starting tests, this means that almost no noise (e.g. clicking noise or popping noise) exists in the analog output signal AOS. However, if the flip-flop signal FFS is changed to a voltage level corresponding to the logic value '1', this means that some noise exists in the analog output signal AOS. Therefore, the logic tester 154 can determine the test result for the DUT 10 according to the flip-flop signal FFS.

It should be noted that, in FIG. 1, a positive input terminal and negative input terminal of the second comparing circuit 142 are utilized for receiving the amplified signal AS and second reference level RL2 respectively. However, in another embodiment, the positive input terminal and negative input terminal of the second comparing circuit 142 can be utilized for receiving the second reference level RL2 and amplified signal AS respectively, and the inverter 151 is therefore removed from the result-examining module 150. The OR gate 152 can perform the logic OR operation on the first result signal RS1 and second result signal RS2 directly to generate the combined signal CS. This also falls within the scope of the present invention.

Figure 2:
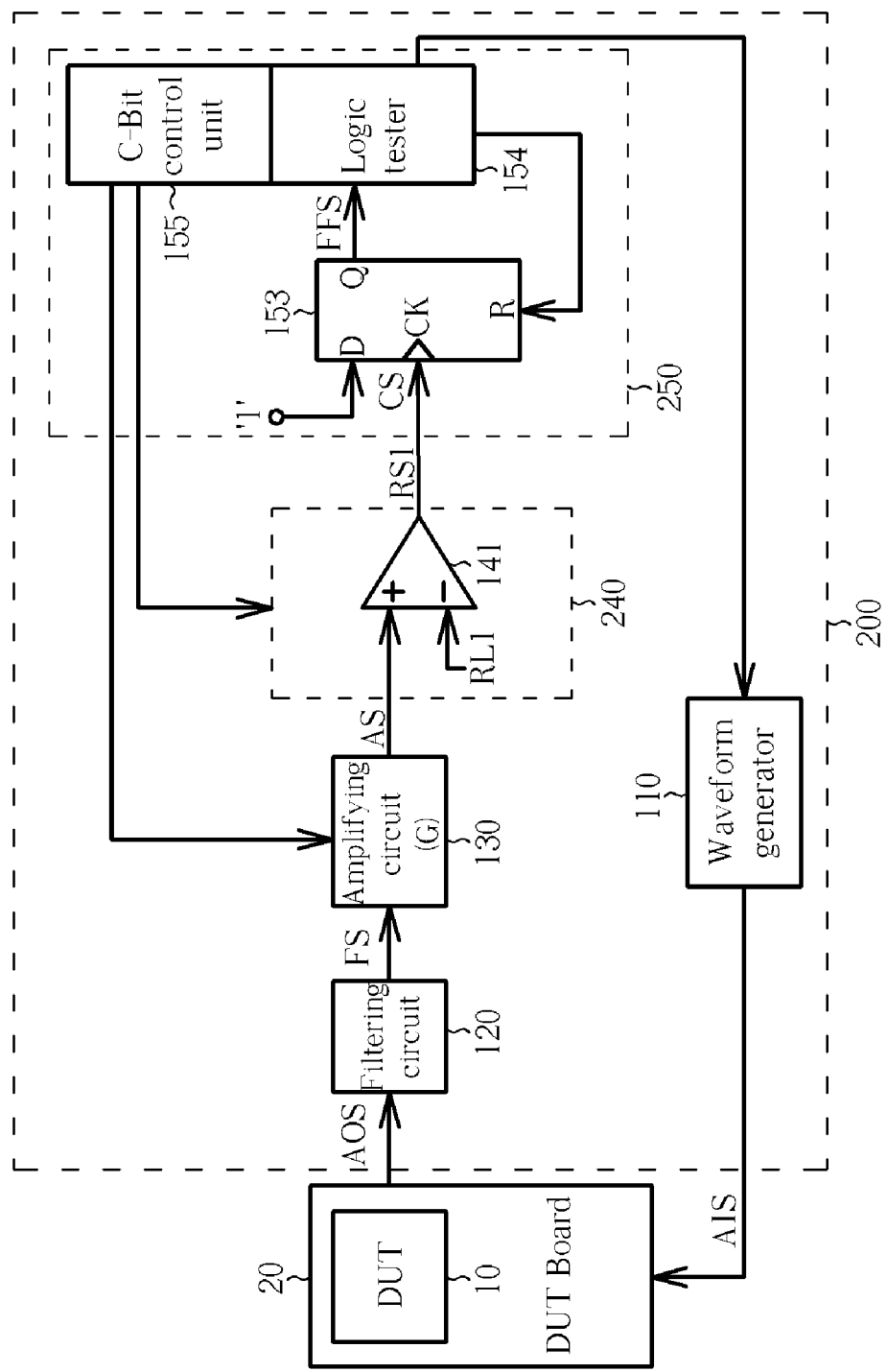
FIG. 2 is a diagram of a circuit testing apparatus according to a second embodiment of the present invention.
Figure 3:
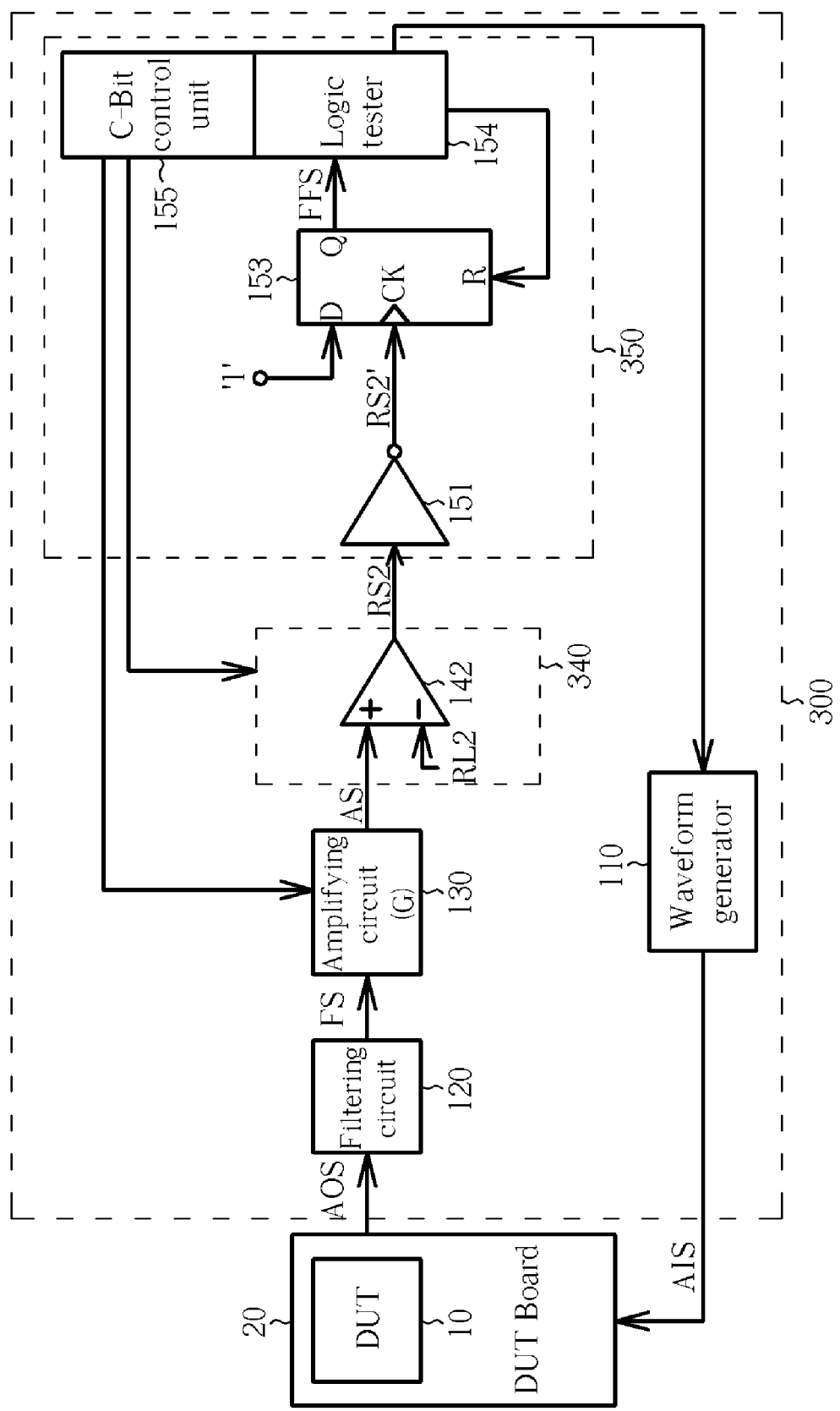
FIG. 3 is a diagram of a circuit testing apparatus according to a third embodiment of the present invention.

The circuit testing apparatus 100 shown in FIG. 1 can be utilized for testing if higher positive and lower negative voltages caused by noise exist in the analog output signal AOS. However, if it is desired to only test whether or not a higher positive voltage caused by noise exists in the analog output signal AOS, the second comparing circuit 142, the inverter 151, and the OR gate 152 can be removed from the circuit testing apparatus 100. Please refer to FIG. 2. FIG. 2 is a diagram of a circuit testing apparatus 200 according to a second embodiment of the present invention. As shown in FIG. 2, the clock input terminal CK of the flip-flop 153 is directly connected to the first comparing circuit 141 and utilized for receiving the first result signal RS1. Similarly, if it is desired to only test whether or not a lower negative voltage caused by noise exists in the analog output signal AOS, the first comparing circuit 141 and the OR gate 152 can be removed from the circuit testing apparatus 100 shown in FIG. 1. Please refer to FIG. 3. FIG. 3 is a diagram of a circuit testing apparatus 300 according to a third embodiment of the present invention. As shown in FIG. 3, the clock input terminal CK of the flip-flop 153 is directly connected to the inverter 151 and utilized for receiving the inverted result signal RS2. Please note that, in the circuit testing apparatus 300 shown in FIG. 3, the positive and negative input terminals of the second comparing circuit 142 are utilized for receiving the amplified signal AS and the second reference level RL2 respectively. In another embodiment, however, the positive and negative input terminals of the second comparing circuit 142 can also be utilized for receiving the second reference level RL2 and the amplified signal AS respectively. Therefore, the inverter 151 can be removed from the result-examining module 350, and the clock input terminal CK of the flip-flop 153 be directly connected to the second comparing circuit 141 for receiving the second result signal RS2.

In the above-mentioned embodiments, through the C-Bit control unit 155, the logic tester 154 can control the gain of the amplifying circuit 130 and the reference levels, so the circuit testing apparatus can be utilized for testing voltages caused by different noise levels adaptively. Additionally, through the circuit testing apparatus in each of the above-mentioned embodiments, the accuracy of noise testing can be improved; even a voltage difference (5 mV) incurred by noise can also be detected by the circuit testing apparatus. This accuracy is more precise than that of a conventional circuit testing apparatus. Due to the improved accuracy, when the circuit testing apparatus in the present invention are utilized for testing an analog signal, the reliability of the test result will also be improved considerably. Moreover, the components in each embodiment of the present invention are not more expensive than the mixed-signal tester (which is usually very expensive) utilized by the conventional testing scheme. As mentioned above, by utilizing the circuit testing apparatus, not only hardware cost is reduced but the efficiency is also improved while testing signals. The above-mentioned description details the advantages of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit testing apparatus for testing a device under test, comprising:
   a filtering circuit, coupled to the device under test, for filtering an analog output signal generated from the device under test to generate a filtered signal;
   an amplifying circuit, coupled to the filtering circuit, for amplifying the filtered signal to generate an amplified signal;
   a comparing module, coupled to the amplifying circuit, for comparing the amplified signal with at least a reference level to generate at least a result signal, wherein the reference level is not received by the device under test and not generated based on the device under test; and
   a result-examining module, coupled to the comparing module, for examining the result signal to determine a test result for the device under test.

2. The circuit testing apparatus of claim 1, wherein the analog output signal is an analog audio signal.

3. The circuit testing apparatus of claim 1, wherein the filtering circuit is utilized for filtering out a frequency component in the analog output signal outside a band where sounds are capable of being heard by human ears in order to generate the filtered signal.

4. The circuit testing apparatus of claim 1, wherein the comparing module comprises:
   a first comparing circuit, coupled to the amplifying circuit, for comparing the amplified signal with a first reference level to generate a first result signal; and
   a second comparing circuit, coupled to the amplifying circuit, for comparing the amplified signal with a second reference level to generate a second result signal.

5. The circuit testing apparatus of claim 4, wherein the first reference level is a positive voltage level, and the second reference level is a negative voltage level.

6. The circuit testing apparatus of claim 4, wherein the result-examining module comprises:
   an inverter, coupled to the second comparing circuit, for inverting the second result signal to generate an inverted result signal;
   an OR gate, coupled to the first comparing circuit and the inverter, for performing a logic OR operation on the first result signal and the inverted result signal to generate a combined signal;
   a flip-flop, having an input terminal, a clock input terminal, and an output terminal, the input terminal being utilized for receiving a specific logic value, the clock input terminal being coupled to the OR gate to receive the combined signal, and the output terminal being utilized for outputting a flip-flop signal; and
   a logic tester, coupled to the output terminal of the flip-flop, for determining a test result of the device under test according to the flip-flop signal.

7. The circuit testing apparatus of claim 6, wherein the logic tester further comprises:
   a continuous built-in test (C-Bit) control unit, coupled to the amplifying circuit and the comparing module, for controlling a gain of the amplifying circuit and for controlling at least a reference level.

8. The circuit testing apparatus of claim 6, further comprising:
   a waveform generator, coupled to the device under test and the logic tester, for providing the device under test with an analog input signal according to a control of the logic tester;
   wherein the device under test generates the analog output signal according to the analog input signal.

9. The circuit testing apparatus of claim 4, wherein the result-examining module comprises:
   an OR gate, coupled to the comparing module, for performing a logic OR operation on the first result signal and the second result signal to generate a combined signal;
   a flip-flop, having an input terminal, a clock terminal, and an output terminal, the input terminal being utilized for receiving a specific logic value, the clock input terminal being coupled to the OR gate to receive the combined signal, and the output terminal being utilized for outputting a flip-flop signal; and
   a logic tester, coupled to the output terminal of the flip-flop, for determining a test result of the device under test according to the flip-flop signal.

10. The circuit testing apparatus of claim 9, wherein the logic tester further comprises:
    a continuous built-in test control unit, coupled to the amplifying circuit and the comparing module, for controlling a gain of the amplifying circuit and for controlling at least a reference level.

11. The circuit testing apparatus of claim 9, further comprising:
    a waveform generator, coupled to the device under test and the logic tester, for providing the device under test with an analog input signal according to a control of the logic tester;
    wherein the device under test generates the analog output signal according to the analog input signal.

12. The circuit testing apparatus of claim 1, wherein the comparing module comprises:
    a comparing circuit, coupled to the amplifying circuit, for comparing the amplified signal with a reference level in the reference level to generate a result signal.

13. The circuit testing apparatus of claim 12, wherein the result-examining module comprises:
    a flip-flop, having an input terminal for receiving a specific logic value, a clock terminal being coupled to the OR gate to receive the combined signal, and an output terminal for outputting a flip-flop signal; and
    a logic tester, coupled to the output terminal of the flip-flop, for determining a test result of the device under test according to the flip-flop signal.

14. The circuit testing apparatus of claim 13, wherein the logic tester further comprises:
    a continuous built-in test control unit, coupled to the amplifying circuit and the comparing module, for controlling a gain of the amplifying circuit and for controlling the reference level.

15. The circuit testing apparatus of claim 13, further comprising:
    a waveform generator, coupled to the device under test and the logic tester, for providing the device under test with an analog input signal according to a control of the logic tester;
    wherein the device under test generates the analog output signal according to the analog input signal.

16. The circuit testing apparatus of claim 12, wherein the result-examining module comprises:
    an inverter, coupled to the comparing circuit, for inverting the result signal to generate an inverted result signal;
    a flip-flop, having an input terminal for receiving a specific logic value, a clock input terminal being coupled to the inverter to receive the inverted result signal, and an output terminal for outputting a flip-flop signal; and a logic tester, coupled to the output terminal of the flip-flop, for determining a test result of the device under test according to the flip-flop signal.

17. The circuit testing apparatus of claim 16, wherein the logic tester further comprises:

a continuous built-in test control unit, coupled to the amplifying circuit and the comparing module, for controlling a gain of the amplifying circuit and for controlling the reference level.

18. The circuit testing apparatus of claim 16, further comprising:

a waveform generator, coupled to the device under test and the logic tester, for providing the device under test with an analog input signal according to a control of the logic tester;

wherein the device under test generates the analog output signal according to the analog input signal.

19. A circuit testing apparatus for testing a device under test, comprising:

a filtering circuit, coupled to the device under test which is externally coupled to the circuit testing apparatus, for filtering an analog output signal generated from the device under test to generate a filtered signal;

an amplifying circuit, coupled to the filtering circuit, for amplifying the filtered signal to generate an amplified signal;

a comparing module, coupled to the amplifying circuit, for comparing the amplified signal with at least a reference level to generate at least a result signal; and a result-examining module, coupled to the comparing module, for examining the result signal to determine a test result for the device under test.

20. A circuit testing apparatus for testing a device under test, comprising:

a filtering circuit, coupled to the device under test, for filtering an analog output signal generated from the device under test to generate a filtered signal;

an amplifying circuit, coupled to the filtering circuit, for amplifying the filtered signal to generate an amplified signal;

a comparing module, coupled to the amplifying circuit, for comparing the amplified signal with at least a reference level to generate at least a result signal; and a result-examining module, coupled to the comparing module, for examining the result signal to determine a test result for the device under test;

wherein the filtering circuit is utilized for filtering out a frequency component in the analog output signal outside a band where sounds are capable of being heard by human ears in order to generate the filtered signal.

* * * * *